(12) United States Patent
Lee et al.

(10) Patent No.: US 8,400,390 B2
(45) Date of Patent: Mar. 19, 2013

(54) GATE DRIVING DEVICE AND LIQUID CRYSTAL DISPLAY HAVING THE SAME

(75) Inventors: Min-Cheol Lee, Seoul (KR);
Seung-Hwan Moon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 723 days.

(21) Appl. No.: 12/645,902

(22) Filed: Dec. 23, 2009

(65) Prior Publication Data
US 2010/0156869 A1    Jun. 24, 2010

(30) Foreign Application Priority Data

Dec. 24, 2008   (KR) .................. 10-2008-0133615

(51) Int. Cl.
G09G 3/36    (2006.01)
G06F 3/038   (2006.01)
G09G 5/00    (2006.01)

(52) U.S. Cl. ........................ 345/100; 345/204
(58) Field of Classification Search .......... None
See application file for complete search history.

(56) References Cited

U.S. PATENT DOCUMENTS

| 2003/0189542 | A1* | 10/2003 | Lee et al. ............ 345/93 |
| 2003/0227433 | A1* | 12/2003 | Moon ............... 345/100 |
| 2008/0218502 | A1* | 9/2008  | Lee et al. ........... 345/208 |
| 2008/0266477 | A1* | 10/2008 | Lee et al. ............ 349/46 |
| 2008/0278214 | A1* | 11/2008 | Yoon et al. .......... 327/379 |

FOREIGN PATENT DOCUMENTS

| KR | 10-2004-0003285 | 1/2004 |
| KR | 10-2006-0030697 | 4/2006 |
| KR | 10-2007-0041878 | 4/2007 |

* cited by examiner

*Primary Examiner* — Joseph Haley
*Assistant Examiner* — Nicholas Lee
(74) *Attorney, Agent, or Firm* — Cantor Colburn LLP

(57) ABSTRACT

A gate driving device includes a plurality of stages, a first dummy stage connected to the plurality of stages and a second dummy stage connected to the first dummy stage. Stages of the plurality of stages are cascaded. The first dummy stage includes a first charge unit which receives a first input signal from a previous stage of the plurality of stages and is thereby charged, and a first pull-up transistor which outputs a clock signal when the first charge unit reaches a first charge level. The second dummy stage includes a second charge unit which receives a second input signal from the first dummy stage and is thereby charged, and a second pull-up transistor which outputs the clock signal when the second charge unit reaches a second charge level higher than the first charge level.

18 Claims, 11 Drawing Sheets

GATE DRIVING DEVICE AND LIQUID CRYSTAL DISPLAY HAVING THE SAME

This application claims priority to Korean Patent Application No. 10-2008-0133615, filed on Dec. 24, 2008, and all the benefits accruing therefrom under 35 U.S.C. §119, the contents of which in its entirety are herein incorporated by reference.

BACKGROUND OF THE INVENTION

1. Field of the Invention

The present invention relates to a gate driving device and a liquid crystal display having the same and, more particularly, the present invention relates to a gate driving device providing substantially improved display quality in a liquid crystal display having the gate driving device.

2. Description of the Related Art

Liquid crystal displays ("LCDs") generally include gate driving integrated circuits ("ICs") which are mounted in the form of a tape carrier package ("TCP"), a chip-on-glass ("COG"), or other suitable mounting method. In attempts to improve manufacturing costs or size and design characteristics of LCDs, several alternative mounting methods have been explored. More specifically, for example, gate driving ICs have been replaced with a gate driving device, which generates gate signals using amorphous silicon thin film transistors ("a-Si TFTs"), mounted on a glass substrate.

However, further improvement of display quality of an LCD having the gate driving device is required.

BRIEF SUMMARY OF THE INVENTION

The present invention provides a gate driving device having substantially improved display quality.

The present invention also provides a liquid crystal display having the gate driving device.

According to an exemplary embodiment, a gate driving device includes a plurality of stages, a first dummy stage connected to the plurality of stages and a second dummy stage connected to the first dummy stage. Stages of the plurality of stages are cascaded. The first dummy stage includes a first charge unit which receives a first input signal from a previous stage of the plurality of stages and is thereby charged, and a first pull-up transistor which outputs a clock signal when the first charge unit reaches a first charge level. The second dummy stage includes a second charge unit which receives a second input signal from the first dummy stage and is thereby charged, and a second pull-up transistor which outputs the clock signal when the second charge unit reaches a second charge level higher than the first charge level.

According to an alternative exemplary embodiment, a liquid crystal display includes a liquid crystal panel including gate lines, and a gate driving device including a plurality of stages, a first dummy stage connected to the plurality of stages and a second dummy stage connected to the first dummy stage. Stages of the plurality of stages are cascaded. The first dummy stage includes a first charge unit which receives a first input signal from a previous stage and is thereby charged, and a first pull-up transistor which outputs a clock signal when the first charge unit reaches a first charge level. The second dummy stage includes a second charge unit which receives a second input signal from the first dummy stage and is thereby charged, and a second pull-up transistor which outputs the clock signal when the second charge unit reaches a second charge level higher than the first charge level.

According to another alternative exemplary embodiment, a liquid crystal display includes a liquid crystal panel including gate lines, and a gate driving device including a plurality of stages, a first dummy stage connected to the plurality of stages and a second dummy stage connected to the first dummy stage. Stages of the plurality of stages are cascaded. The stages are connected to the gate lines to sequentially supply gate signals thereto. The first dummy stage includes a first charge unit which receives a first input signal from a previous stage of the plurality of stages and is thereby charged, and a first pull-up transistor which has a first channel width. The second dummy stage includes a second charge unit which receives a second input signal from the first dummy stage and is thereby charged, and a second pull-up transistor which has a second channel width greater than the first channel width.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
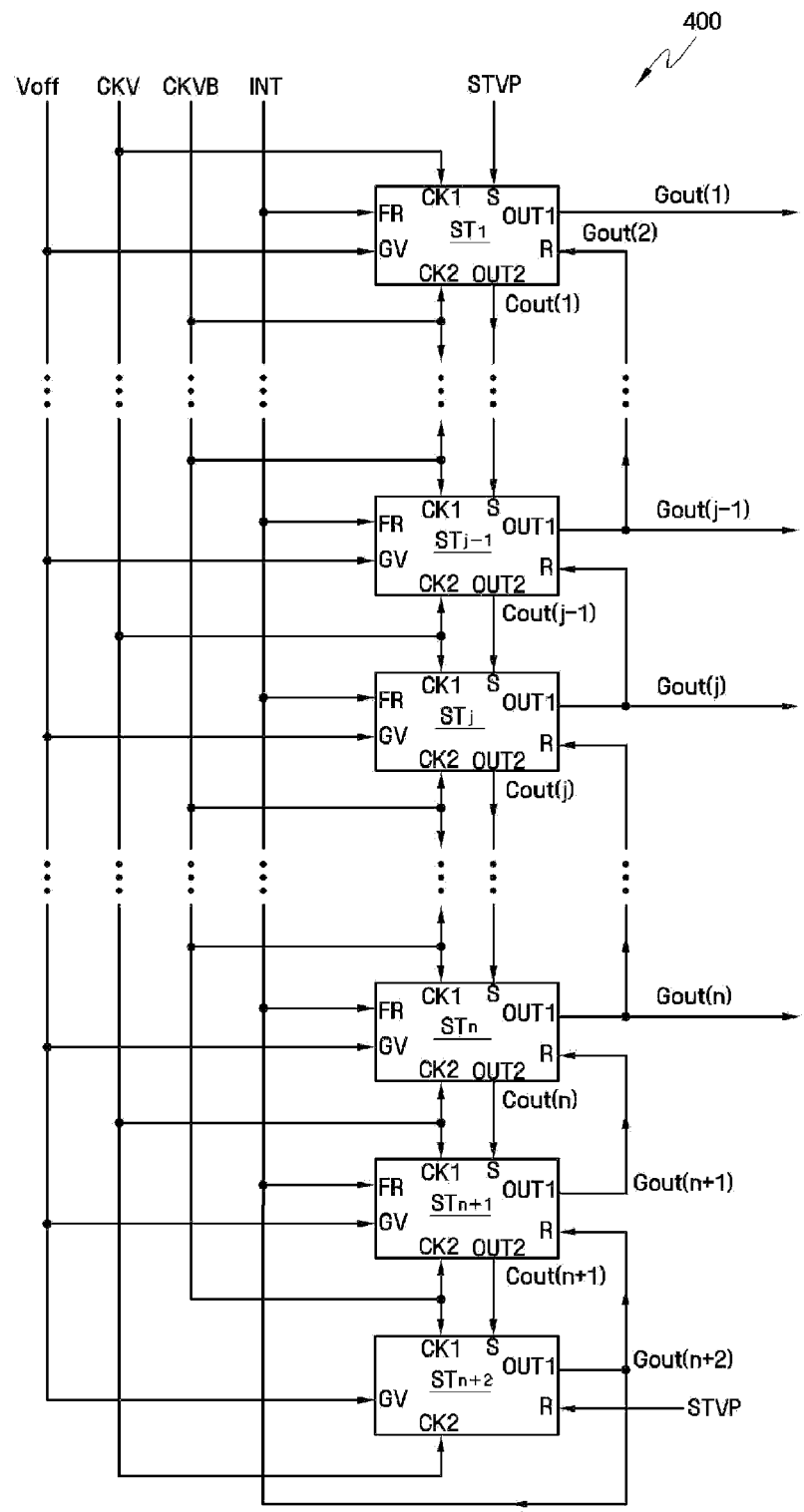
FIG. 1 is a block diagram of an exemplary embodiment of a gate driving device according to the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, a gate driving device and a liquid crystal display ("LCD") having the same according to exemplary embodiments will be described in further detail with reference to the accompanying drawings.

Figure 2:
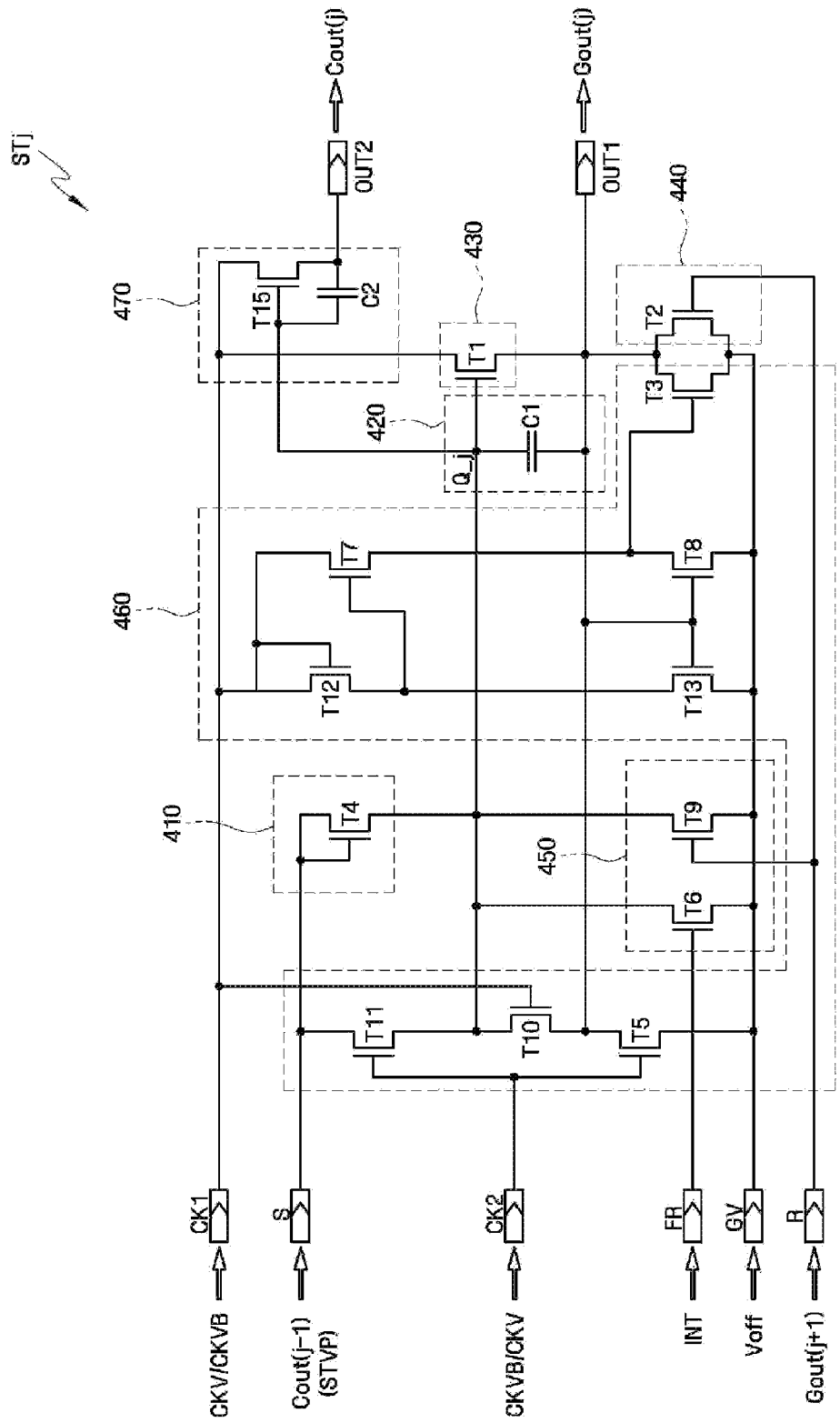
FIG. 2 is a schematic circuit diagram of an exemplary embodiment of a stage of the gate driving device shown in FIG. 1.
Figure 3:
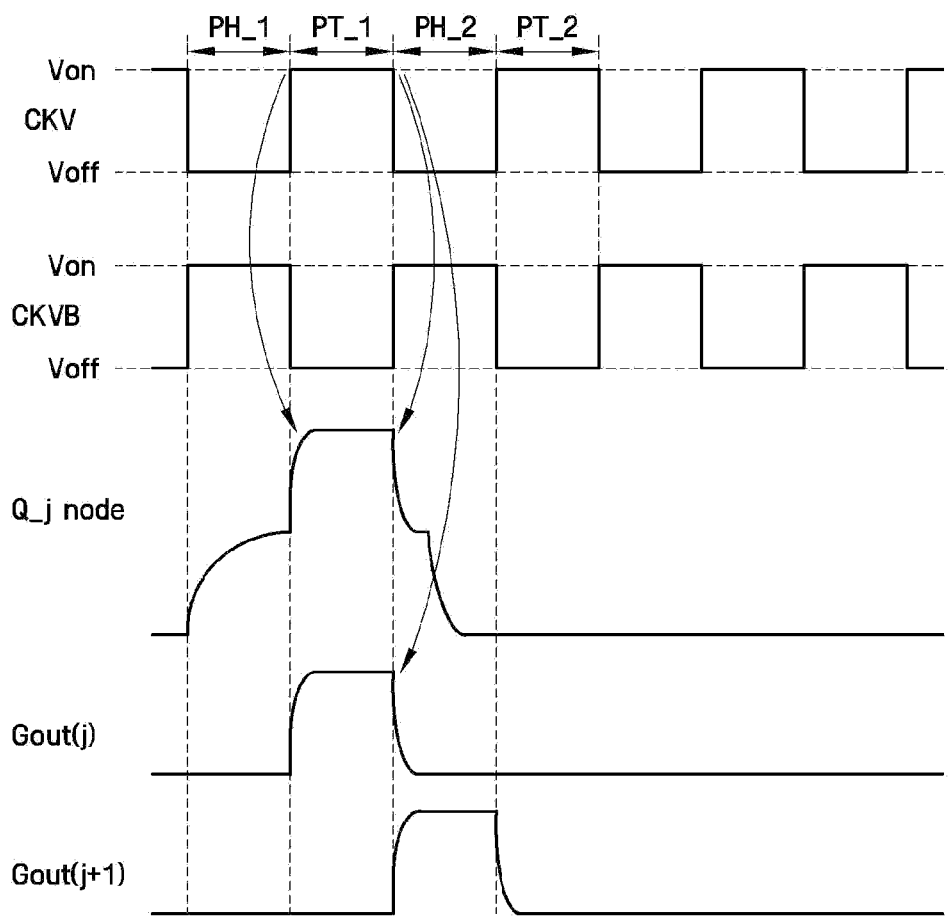
FIG. 3 is a signal timing diagram illustrating an exemplary embodiment of an operation of a jth stage of the gate driving device shown in FIG. 1.
Figure 4:
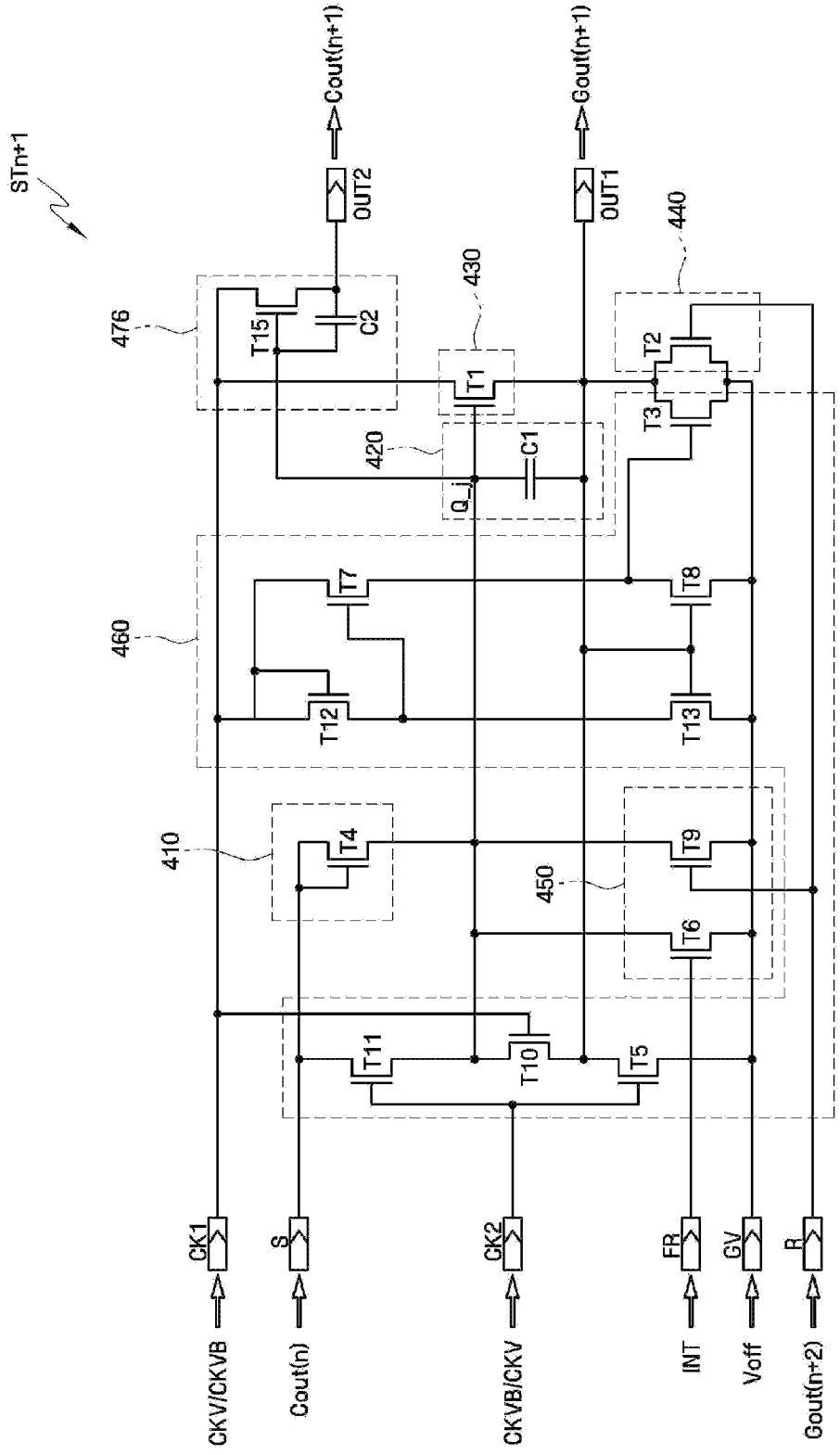
FIGS. 4 and 5 are schematic circuit diagrams of exemplary embodiments of dummy stages of the gate driving device shown in FIG. 1.
Figure 5:
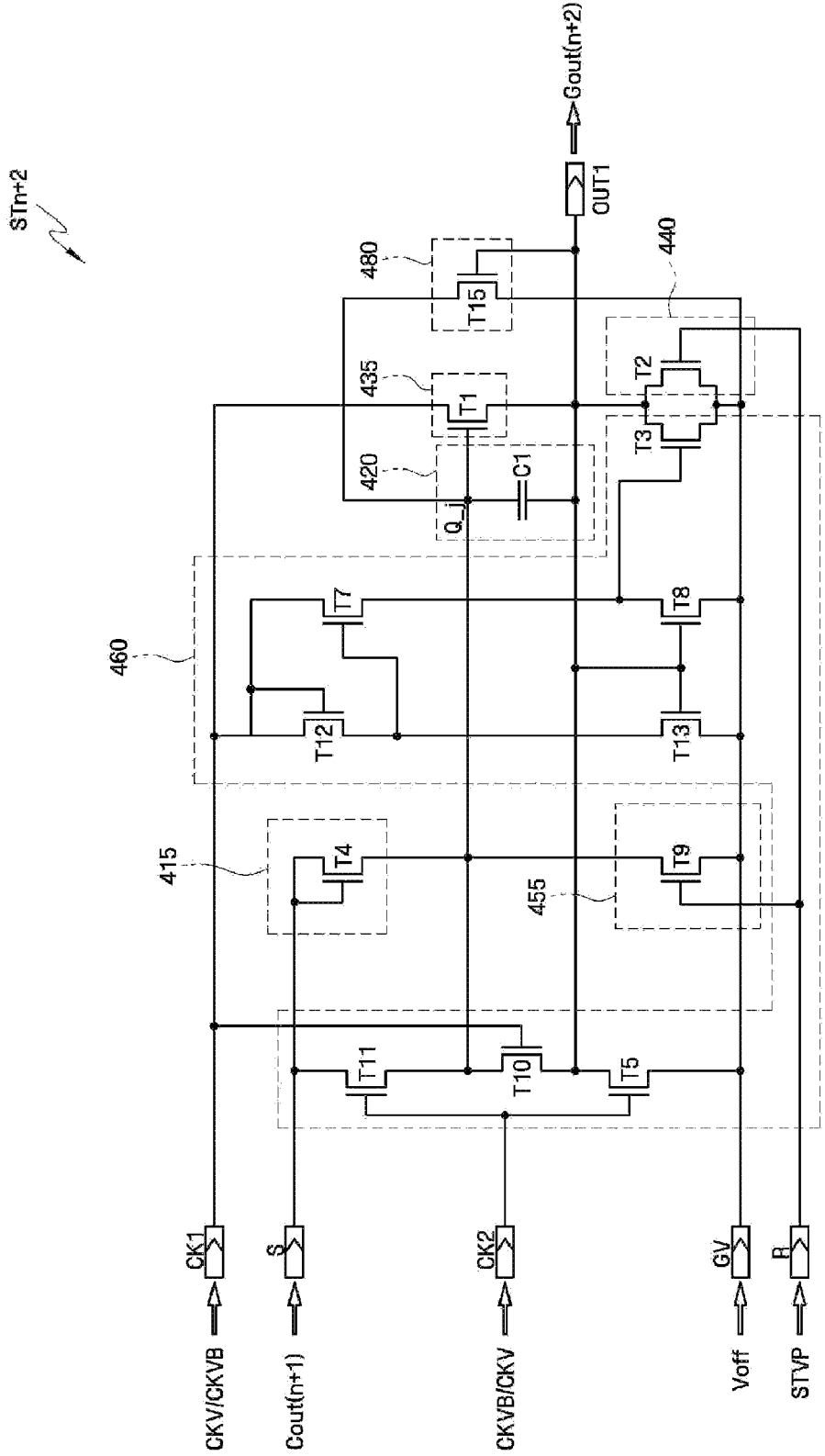

First, a gate driving device according to an embodiment of the present invention will be described with reference to FIGS. 1 through 5. FIG. 1 is a block diagram of an exemplary embodiment of a gate driving device according to the present invention, FIG. 2 is a schematic circuit diagram of an exemplary embodiment of a stage (e.g., a jth stage) of the gate driving device shown in FIG. 1, FIG. 3 is a signal timing diagram illustrating an exemplary embodiment of an operation of the jth stage of the gate driving device shown in FIG. 1, FIG. 4 is a schematic circuit diagram of an exemplary embodiment of a dummy stage (e.g., an (n+2)th dummy stage) of the gate driving device shown in FIG. 1, and FIG. 5 is a schematic circuit diagram of an exemplary embodiment of a dummy stage (e.g., an (n+1)th dummy stage) of the gate driving device shown in FIG. 1.

Referring first to FIG. 1, the gate driving device 400 according to an exemplary embodiment includes a plurality of stages $ST_1$ to $ST_n$, and a first dummy stage $ST_{n+1}$ and a second dummy stage $ST_{n+2}$, which are sequentially arranged, as illustrated in FIG. 1. Stages $ST_j$ of the plurality of stages $ST_1$ to $ST_n$ and the first dummy stage $ST_{n+1}$ and the second dummy stage $ST_{n+2}$ are cascaded, e.g., are sequentially connected to one another as shown in FIG. 1, and each of stages $ST_1$ to $ST_n$, but not the first dummy stage $ST_{n+1}$ and the second dummy stage $ST_{n+2}$, is connected to a corresponding gate line G of a plurality of gate lines G1 to Gn (FIG. 6) in a one-to-one correspondence relationship to output a corresponding gate signal Gout(1) to Gout(n), respectively.

The first dummy stage $ST_{n+1}$ and the second dummy stage $ST_{n+2}$ are not connected to the gate lines. However, the first dummy stage $ST_{n+1}$ and the second dummy stage $ST_{n+2}$ output corresponding gate signals Gout(n+1) and Gout(n+2), respectively. More specifically, the first dummy stage $ST_{n+1}$ is connected to a previous stage, e.g., an nth stage $ST_n$ and, more specifically, to a reset terminal R of the nth stage $ST_n$, such that the nth stage $ST_n$ receives the gate signal Gout(n+1) as an input. In a similar manner, the second dummy stage $ST_{n+2}$ is not connected to a corresponding gate line, either. Instead, the second dummy stage $ST_{n+2}$ is connected to a previous stage and, more specifically, to a reset terminal R of the first dummy stage $ST_{n+1}$, such that the first dummy stage $ST_{n+1}$ receives the gate signal Gout(n+2) as an input.

The gate signal Gout(n+2) of the second dummy stage $ST_{n+2}$ is inputted to a frame reset terminal FR of each of the stages $ST_1$ to $ST_n$ and the first dummy stage $ST_{n+1}$, to initialize each of the stages $ST_1$ to $ST_n$ and the first dummy stage $ST_{n+1}$.

The stages $ST_1$ to $ST_n$ and the first dummy stage $ST_{n+1}$ and the second dummy stage $ST_{n+2}$ receive a gate-off voltage Voff, a clock signal CKV and a clock bar signal CKVB. In addition, the stages $ST_1$ to $ST_n$ and the first dummy stage $ST_{n+1}$ receive an initialization signal INT. In an exemplary embodiment, the initialization signal INT may be supplied from the second dummy stage $ST_{n+2}$. In addition, the initialization signal INT may be the gate signal Gout(n+2) of the second dummy stage $ST_{n+2}$.

Each of the stages $ST_1$ to $ST_n$ and the first dummy stage $ST_{n+1}$ and the second dummy stage $ST_{n+2}$ may include a first clock terminal CK1, a second clock terminal CK2, a set terminal S, a reset terminal R, a power supply voltage terminal GV, a frame reset terminal FR, a gate signal output terminal OUT1 and a carry output terminal OUT2.

Hereinafter, for purposes illustration, a jth stage $ST_j$ (where j is not equal to 1) of the stages $ST_1$ to $ST_{n+1}$ will be described in further detail. In an exemplary embodiment, the jth stage $ST_j$ includes a set terminal S to which a carry signal Cout(j−1) of a previous stage, e.g., a (j−1)th stage $ST_{j-1}$, is input, a reset terminal R to which a gate signal Gout(j+1) of a next stage, e.g., a (j+1)th stage $ST_{j+1}$, is input, a first clock terminal CK1 and a second clock terminal CK2 to which the first clock signal CKV and the clock bar signal CKVB, respectively, are inputted, a power supply voltage terminal GV to which the gate-off voltage Voff is input, and a frame reset terminal FR to which the initialization signal INT or, alternatively, the carry signal Cout(n+1) of the first dummy stage $ST_{n+1}$ is input. The jth stage $ST_j$ may also include a gate signal output terminal OUT1 through which a gate signal Gout(j) is output, and a carry output terminal OUT2 through which the carry signal Cout(j) is output.

However, a first scan start signal STVP, instead of the carry signal of a previous stage, is input to the set terminal S of the first stage $ST_1$, while the first scan start signal STVP, instead of a gate signal of a next stage, is input to the reset terminal R of the first dummy stage $ST_{n+1}$, as shown in FIG. 1.

As also shown in FIG. 1, a frame reset terminal FR and a carry output terminal OUT2 are not included in the second dummy stage $ST_{n+2}$. In an alternative exemplary embodiment, however, the second dummy stage $ST_{n+2}$ may include a frame reset terminal FR and/or a carry output terminal OUT2, but in this case the second dummy stage $ST_{n+2}$ does not input/output the initialization signal INT and the carry signal.

In addition, as will be described in greater detail below with reference to FIGS. 4 and 5, the first dummy stage $ST_{n+1}$ includes a first charge unit which receives a first input signal from a previous stage, e.g., the nth stage $ST_n$, and is thereby charged, and a first pull-up transistor which outputs a clock signal when the first charge unit reaches a first charge level. Additionally, the second dummy stage $ST_{n+2}$ includes a second charge unit which receives a second input signal from the dummy stage $ST_{n+1}$ and is thereby charged, and a second pull-up transistor which outputs a clock signal when the second charge unit reaches a second charge level.

The jth stage $ST_j$ (FIG. 1) will now be described in further detail with reference to FIGS. 2 and 3.

Referring to FIG. 2, the jth stage $ST_j$ includes a buffer unit 410, a charge unit 420, a pull-up unit 430, a carry signal generator 470, a pull-down unit 440, a discharge unit 450 and a holding unit 460. The jth stage $ST_j$ receives a carry signal Cout(j−1) of the previous stage $ST_{j-1}$, the clock signal CKV and the clock bar signal CKVB. As shown in FIG. 3, the clock signal CKV includes a first hold period PH_1 and a second hold period PH_2 when the clock signal CKV is maintained at a low level, and the clock signal CKV includes a first transition period PT_1 and a second transition period PT_2 when the clock signal CKV transitions to a high level (e.g., to a second level) from a low level (e.g., from a first level) and vice versa, e.g., to the low level (e.g. the first level) from the high level (e.g., the second level). Thus, the first transition period PT_1 and the second transition period PT_2 are periods between a rising edge to a falling edge of the clock signal CKV.

In an exemplary embodiment, the buffer unit 410 includes a transistor T4 which is configured as a diode. The buffer unit 410 supplies the carry signal Cout(j−1) of the previous stage $ST_{j-1}$ to the charge unit 420, the carry signal generator 470 and the pull-up unit 430.

The charge unit 420 includes a capacitor C1 having a first terminal connected to a source terminal of the transistor T4, the pull-up unit 430 and the discharge unit 450, and a second terminal connected to the gate-output terminal OUT1.

The pull-up unit 430 includes a transistor T1 having a drain terminal connected to the first clock terminal CK1, a gate terminal connected to the charge unit 420 and a source terminal connected to the gate-output terminal OUT1.

The carry signal generator 470 includes a carry signal generating transistor T15 having a drain terminal connected to the first clock terminal CK1, a source terminal connected to the carry output terminal OUT2, and a gate terminal connected to the buffer unit 410. The carry signal generator 470 also includes a capacitor C2 having a first terminal connected to the gate terminal of the carry signal generating transistor T15 and a second terminal connected to the source terminal of the carry signal generating transistor T15.

The pull-down unit 440 includes a transistor T2 having a drain terminal connected to the source terminal of the transistor T1 and to the second terminal of the capacitor C1, a source terminal connected to the power supply voltage terminal GV, and a gate terminal connected to the reset terminal R.

The discharge unit 450 includes a transistor T9 and a transistor T6. The transistor T9 discharges the charge unit 420 in response to the gate signal Gout(j+1) of the next stage $ST_{j+1}$. The transistor T6 discharges the charge unit 420 in response to the initialization signal INT. The transistor T9 includes a gate terminal connected to the reset terminal R, a drain terminal connected to a first terminal of a capacitor C1 and a source terminal connected to the power supply voltage terminal GV.

When the gate signal Gout(j) makes a transition to a high level (e.g., a second level) from a low level (e.g., a first level), a holding unit 460, which includes transistors T3, T5, T7, T8, T10, T11, T12 and T13, holds the gate signal Gout(j) at the high level. When the gate signal Gout(j) makes a transition to the low level from the high level, the holding unit 460 holds the gate signal Gout(j) at the low level during one frame, regardless of a voltage level of the clock signal CKV and/or a voltage level of the clock bar signal CKVB.

An operation of the abovementioned components will hereinafter be described in further detail with reference to FIGS. 2 and 3.

A process in which the gate signal Gout(j) transitions to the gate-on voltage Von from the gate-off voltage Voff will now be described in further detail.

The charge unit 420 receives the carry signal Cout(j−1) of the previous stage $ST_{j-1}$, and the charge unit 420 is thereby charged. More specifically, during the first hold period PH_1, the charge unit 420 receives the carry signal Cout(j−1) of the previous stage $ST_{j-1}$ and the charge unit 420 is thereby charged. As a result, a voltage level at a node Q_j increases to a first charge level. However, during the first transition period PT_1, which is the period when the clock signal CKV transitions to the high level from the low level, the level of the node Q_j further increases to a second charge level, due to the transistor T1 and a parasitic capacitance.

When the voltage (which is a positive voltage in an exemplary embodiment) of the charge unit 420, that is the voltage level at the node Q_j, increases to the first charge level, the transistor T1 of the pull-up unit 430 is turned on and thereby supplies the clock signal CKV to the gate signal output terminal OUT1. The clock signal CKV is inputted through the first clock terminal CK1. In an exemplary embodiment, the gate signal Gout(j) is the clock signal CKV. Thus, in an exemplary embodiment, a level of the gate signal Gout(j) is the same as a level of the gate-on voltage Von. The carry signal generating transistor T15 of the carry signal generator 470 is turned on, to supply the clock signal CKV to the carry output terminal OUT2. In an exemplary embodiment, the carry signal Cout(j) corresponds to the clock signal CKV.

A process in which the gate signal Gout(j) transitions to the gate-off voltage Voff from the gate-on voltage Von will now be described in further detail.

During the first transition period PT_1 when the clock signal CKV transitions to the low level from the high level, the voltage of the node Q_j decreases because of the parasitic capacitance. In an exemplary embodiment, when the gate signal Gout(j+1) of the next stage $ST_{j+1}$ is at the high level, the transistor T9 of the discharge unit 450 is turned on and thereby supplies the gate-off voltage Voff to the node Q_j. However, the clock bar signal CKVB transitions to the high level from the low level, and the transistor T11 of the holding unit 460 is thereby turned on and supplies the carry signal Cout(j-1) of the previous stage $ST_{j-1}$ to the node Q_j. In an exemplary embodiment, the carry signal Cout(j-1) of the previous stage $ST_{j-1}$ is a positive voltage. Therefore, even when the discharge unit 450 supplies the gate-off voltage Voff to the node Q_j, the voltage of the node Q_j is not quickly pulled down to the gate-off voltage Voff. Instead, as illustrated in FIG. 3, the voltage of the node Q_j is gradually pulled down to gate-off voltage Voff.

Put another way, when the gate signal Gout(j+1) of the next stage $ST_{j+1}$ is at the high level, the transistor T1 of the pull-up unit 430 is not turned off and continues to supply the clock signal CKV to the gate signal Gout(j). The clock signal CKV is at the low level. In addition, when the gate signal Gout(j+1) of the next stage $ST_{j+1}$ is at the high level, the pull-down transistor T2 of the pull-down unit 440 is turned on and supplies the gate-off voltage Voff to the gate signal output terminal OUT1. A level of the gate signal Gout(j) is quickly pulled down to the level of the gate-off voltage Voff because the pull-down unit 440 decreases the gate signal Gout(j) to the gate-off voltage Voff, and the pull-up unit 430 supplies the clock signal CKV, which is at the low level, as the gate signal Gout(j). Therefore, the gate signal Gout(j) does not temporally overlap with the gate signal Gout(j+1) of the next stage $ST_{j+1}$.

An operation which holds the gate signal Gout(j) to the gate-off voltage Voff during one frame after the gate signal Gout(j) decreases to the gate-off voltage Voff will now be described in further detail.

When the gate signal Gout(j) is pulled down to the gate-off voltage Voff, the transistors T8 and T13 are turned on. The transistor T13 turns off the transistor T7, and the transistor T13 thereby prevents a high level of a clock signal CKV from being applied to the transistor T3, and the transistor T8 turns off the transistor T3. Therefore, in an exemplary embodiment, the gate signal Gout(j) is held at the high level.

Next, the transistors T8 and T13 are turned off after the gate signal Gout(j) makes a transition to the low level from the high level. When the clock signal CKV is at the high level, the transistors T7 and T12 turn on the transistor T3, and the transistors T7 and T12 hold the gate signal Gout(j) at the low level. Further, the transistor T10 is turned on, and the gate of the transistor T1 is held at the low level. Therefore, the high level of the first clock signal CKV is not outputted to the gate signal output terminal OUT1.

The first clock bar signal CKVB is at the high level, and the transistors T5 and T11 are turned on, such that the transistor T5 holds the gate signal Gout(j) at the low level while the transistor T11 holds the first terminal of the capacitor C1 at the low level. Therefore, the gate signal Gout(j) is held at the low level during one frame.

In an exemplary embodiment, the jth stage $ST_j$ may not include the carry signal generator 470. In this case, the jth stage $ST_j$ receives the gate signal Gout(j-1), instead of the carry signal Cout(j-1) of the previous stage $ST_{j-1}$, through the set terminal S thereof, and is thereby operated.

The first dummy stage $ST_{n+1}$ and the second dummy stage $ST_{n+2}$ will now be described in further detail with reference to FIGS. 4 and 5. In FIG. 4, the same reference character denote the same or like elements in FIG. 2, and thus any repetitive detailed description thereof will hereinafter be simplified or omitted.

Referring to FIG. 4, the first dummy stage $ST_{n+1}$ includes substantially the same components as those of the plurality of stages $ST_1$ to $ST_n$. Specifically, the first dummy stage $ST_{n+1}$ includes a first charge unit 420 which receives a first input signal Cout(n) from a previous stage, e.g., an nth stage $ST_n$, and is thereby charged, and a first pull-up transistor T1 which outputs a clock signal CKV, e.g., a first clock signal, when the first charge unit 420 reaches a first charge level.

Referring to FIG. 5, the second dummy stage $ST_{n+2}$ includes a second charge unit 420 which receives a second input signal Cout(n+1) from the first dummy stage $ST_{n+1}$ and is thereby charged, and a second pull-up transistor T1 which outputs a clock signal, e.g., the first clock signal CKV, when the second charge unit 420 reaches a second charge level. In an exemplary embodiment, the second charge level of the second dummy stage $ST_{n+2}$ is higher than the first charge level of the first dummy stage $ST_{n+1}$. More particularly, a channel width of the second pull-up transistor T1 of the second dummy stage $ST_{n+2}$ is greater than a channel width of the first pull-up transistor T1 of the first dummy stage $ST_{n+1}$. As used herein, the channel width means a channel width of a width-length ratio ("W/L") of a channel region of the corresponding transistor. Moreover, the width of each transistor refers to the width of the channel region of each transistor.

Referring again to FIG. 2, when a charge unit 420 of each of the plurality of stages $ST_1$ to $ST_n$ is referred to as a third charge unit 420, and a pull-up transistor T1 that outputs a clock signal according to the voltage of the third charge unit is referred to as a third pull-up transistor T1, the third pull-up transistor T1 of each stage of the plurality of stages $ST_1$ to $ST_n$ outputs the clock signal when a voltage level of the third charge unit 420 reaches the first charge level. More specifically, the first pull-up transistor T1 of the first dummy stage $ST_{n+1}$ and the third pull-up transistor T1 of each stage of the plurality of stages $ST_1$ to $ST_n$ outputs the clock signal in response to a same charge level, e.g., the first charge level. The second pull-up transistor T1 of the second dummy stage $ST_{n+2}$ outputs the clock signal in response to the second charge level which is higher than the first charge level.

In an exemplary embodiment, channel widths of the first to third pull-up transistors T1 of stages of the plurality of stages $ST_1$ to $ST_n$, the first dummy stage STn+1 and the second dummy stage STn+2 may be equal to the width of the first dummy stage $ST_{n+1}$. The width of the second dummy stage $ST_{n+2}$ may be greater than the width of the first dummy stage $ST_{n+1}$.

As described above, the second dummy stage $ST_{n+2}$ outputs the gate signal Gout(n+2), which is inputted to a frame reset terminal FR of each stage of the plurality of stages $ST_1$ to $ST_n$ and the first dummy stage $ST_{n+1}$, as the initialization signal INT. More specifically, the initialization signal INT may be supplied from the second dummy stage $ST_{n+2}$ to the frame reset terminal FR of each stage of the plurality of stages $ST_1$ to $ST_n$ and the first dummy stage $ST_{n+1}$. In an exemplary embodiment, since the frame reset terminal FR is connected to the gate of the transistor T6 which discharges the second dummy stage $ST_{n+2}$, the transistor T6 has a driving capability sufficient to allow the plurality of stages $ST_1$ to $ST_n$ and the transistor T6 of the first dummy stage $ST_{n+1}$ to operate normally.

Specifically, the channel width of the second pull-up transistor T1 of the second dummy stage $ST_{n+2}$ may be determined by a value obtained by multiplying a total parasitic capacitance generated by the gate signal Gout(n+2) of the second dummy stage $ST_{n+2}$, e.g., the initialization signal INT, with a ratio of a channel width of the third pull-up transistors T1 of each stage of the plurality of stages $ST_1$ to $ST_n$ to a parasitic capacitance of a gate line connected to each stage of the plurality of stages $ST_1$ to $ST_n$, e.g., to the third pull-up transistors T1.

In an exemplary embodiment, the parasitic capacitance generated by the initialization signal INT may include parasitic capacitances generated when the initialization signal INT is transmitted to each stage of the plurality of stages $ST_1$ to $ST_n$ and the first dummy stage $ST_{n+1}$. For example, the parasitic capacitance may include parasitic capacitances generated at each interconnection line or the plurality of stages $ST_1$ to $ST_n$ to which the initialization signal INT is transmitted, or at the transistor T6 connected to the frame reset terminal FR of the first dummy stage $ST_{n+1}$.

More specifically, when the parasitic capacitance generated by the gate line Gj connected to the jth stage $ST_j$ is A pF, a width of the pull-up transistor T1 of the jth stage $ST_j$ is B um, and a total capacitance generated by the initialization signal INT of the second dummy stage $ST_{n+2}$ is C pF, the channel width of the second pull-up transistor T1 of the second dummy stage $ST_{n+2}$ is equal to (B/A)*C um. However, alternative exemplary embodiments are not limited thereto, and the channel width of the second pull-up transistor T1 of the second dummy stage $ST_{n+2}$ may be determined in various other ways.

Referring again to FIGS. 2 and 4, each stage of the plurality of stages $ST_1$ to $ST_n$, e.g., a jth stage $ST_j$ of FIG. 2, may include one of the a carry signal generators 470. In addition, the carry signal generator 470 includes a first capacitor C2 which receives a carry signal of a previous stage and is thereby charged, and a first carry signal generating transistor T15 which outputs the clock signal CKV as a first carry signal Cout(1) to Cout(n), e.g., Cout(j) of FIG. 2, when the first capacitor C2 reaches a third charge level. In substantially the same manner, as shown in FIG. 4, the first dummy stage $ST_{n+1}$ may include a carry signal generator 476. The carry signal generator 476 includes a second capacitor C2 which receives a carry signal of a previous stage $ST_n$ of the plurality of stages $ST_1$ to $ST_n$ and is thereby charged, and a second carry signal generating transistor T15 which outputs the clock signal CKV as a second carry signal Cout(n+1) when the second capacitor C2 reaches a fourth charge level.

In an exemplary embodiment, the fourth charge level of the first dummy stage $ST_{n+1}$ is higher than the third charge level of each stage of the plurality of stages $ST_1$ to $ST_n$, e.g., the jth stage $ST_j$. In addition, a channel width of the carry signal generating transistor T15 of the first dummy stage $ST_{n+1}$ is greater than a channel width of carry signal generating transistor T15 of each stage of the plurality of stages $ST_1$ to $ST_n$, e.g., the jth stage $ST_j$. As described above, the pull-up transistor T1 of the second dummy stage $ST_{n+2}$ has outputs the initialization signal INT to each stage of the plurality of stages $ST_1$ to $ST_n$ and the first dummy stage $ST_{n+1}$. The second dummy stage $ST_{n+2}$ receives the carry signal Cout(n+1) from the first dummy stage $ST_{n+1}$. Therefore, the first dummy stage $ST_{n+1}$ generates the carry signal Cout(n+1) corresponding to a driving capability of the second dummy stage $ST_{n+2}$. More particularly, a driving capability the carry signal generating transistor T15 of the first dummy stage $ST_{n+1}$ may correspond to the driving capability of the pull-up transistor T1 of the second dummy stage $ST_{n+2}$.

In terms of charge levels, a charge level for outputting the carry signal Cout(n+1) of the carry signal generating transistor T15 of the first dummy stage $ST_{n+1}$ is greater than a charge level for outputting the carry signal Cout(n+1) of each of the plurality of stages $ST_1$ to $ST_n$. In terms of channel widths, a channel width of the carry signal generating transistor T15 of the first dummy stage $ST_{n+1}$ corresponds to a channel width of the pull-up transistor T1 of the second dummy stage $ST_{n+2}$, and is greater than a channel width of the carry signal generating transistors T15 of each stage of the plurality of stages $ST_1$ to $ST_n$.

Buffer units 410 and 415 of the first dummy stage $ST_{n+1}$ and the second dummy stage $ST_{n+2}$ will now be described in further detail. The buffer unit 410 of the first dummy stage $ST_{n+1}$ includes a first buffer transistor T4 which transmits a first input signal, e.g., the carry signal Cout(n) of the nth stage $ST_n$, to the first charge unit 420. The buffer unit 415 of the second dummy stage $ST_{n+2}$ includes a second buffer transistor T4 which transmits a second input signal, e.g., the carry signal Cout(n+1) of the first dummy stage $ST_{n+1}$, to the second charge unit 420. A larger charge capacitance is required for driving the second dummy stage $ST_{n+2}$ as compared to the first dummy stage $ST_{n+1}$ because the pull-up transistor T1 of the second dummy stage $ST_{n+2}$ has the greater channel width than the pull-up transistor T1 of the first dummy stage $ST_{n+1}$, as described above.

The discharge unit 455 of the first dummy stage $ST_{n+1}$ and the discharge unit 455 of the second dummy stage $ST_{n+2}$ will now be described in further detail. The discharge unit 455 of the first dummy stage $ST_{n+1}$ includes a transistor T9 and a transistor T6. The transistor T9 discharges the charge unit 420 in response to the gate signal $Gout_{(j+1)}$ of the second dummy stage $ST_{n+2}$. The transistor T6 discharges the charge unit 420 in response to the initialization signal INT of the second dummy stage $ST_{n+2}$. The discharge unit 455 of the second dummy stage $ST_{n+2}$ may include a transistor T9 which discharges the charge unit 420 in response to the first scan start signal STVP, instead of a gate signal. In an exemplary embodiment, the second dummy stage $ST_{n+2}$ may not include the transistor T6 for discharging the charge unit 420 in response to the initialization signal INT, as illustrated in FIG. 5.

Put another way, to allow the initialization signal INT of the second dummy stage $ST_{n+2}$ to be transmitted to each of the stages of the plurality of stages $ST_1$ to $ST_n$ and the first dummy stage $ST_{n+1}$ in a stable manner, the channel width of the pull-up transistor T1 of the second dummy stage $ST_{n+2}$ is made to be larger than the channel width of the pull-up transistor T1 of the first dummy stage $ST_{n+1}$, thereby increasing a driving capability of the second dummy stage $ST_{n+2}$. In addition, to increase a driving capability of the second dummy stage $ST_{n+2}$, the channel width of the carry signal generating transistor T15 of the first dummy stage $ST_{n+1}$ is larger than a channel width of the carry signal generating transistor T15 of each stage of the plurality of stages $ST_1$ to $ST_n$, thereby increasing a driving capability of the carry signal of the first dummy stage $ST_{n+1}$. Further, the channel width of the second buffer transistor T4 of the second dummy stage $ST_{n+2}$ is larger than a channel width of the first buffer transistor T4 of the first dummy stage $ST_{n+1}$, thereby sufficiently charging the second charge unit 420 of the second dummy stage $ST_{n+2}$.

Thus, in the gate driving device according to an exemplary embodiment, the driving capability of the pull-up transistor of the second dummy stage is substantially improved, thereby providing for stabilization of an initialization signal provided to a plurality of stages and a first dummy stage, so that gate signals are applied to gate lines even when numbers of gate lines and stages are substantially increased, Accordingly, a display quality of a liquid crystal display according to an exemplary embodiment is substantially improved.

Figure 6:
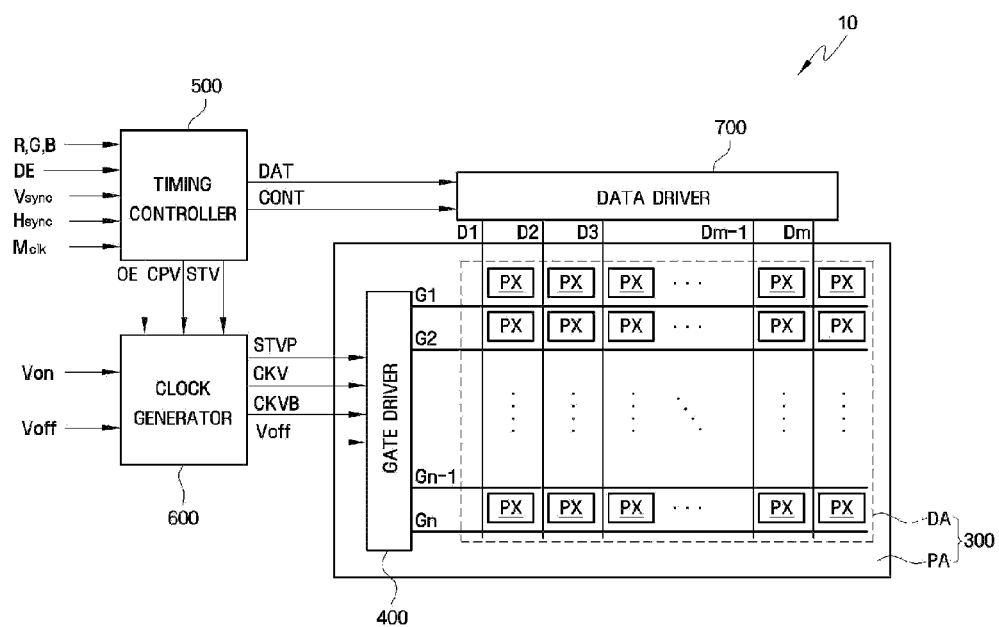
FIG. 6 is a block diagram of an exemplary embodiment of a liquid crystal display according to the present invention.
Figure 7:
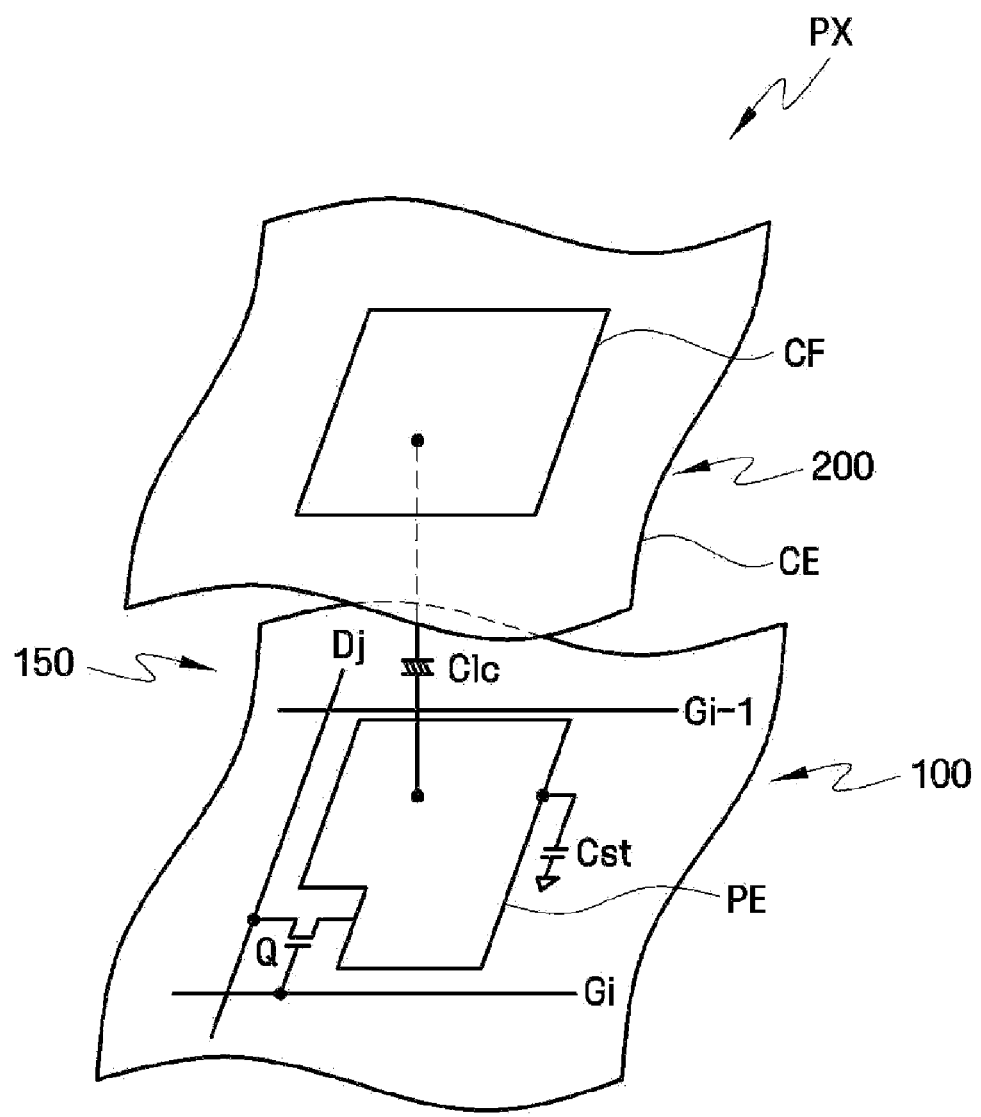
FIG. 7 is an equivalent circuit diagram of a pixel of the liquid crystal display shown in FIG. 6.
Figure 8:
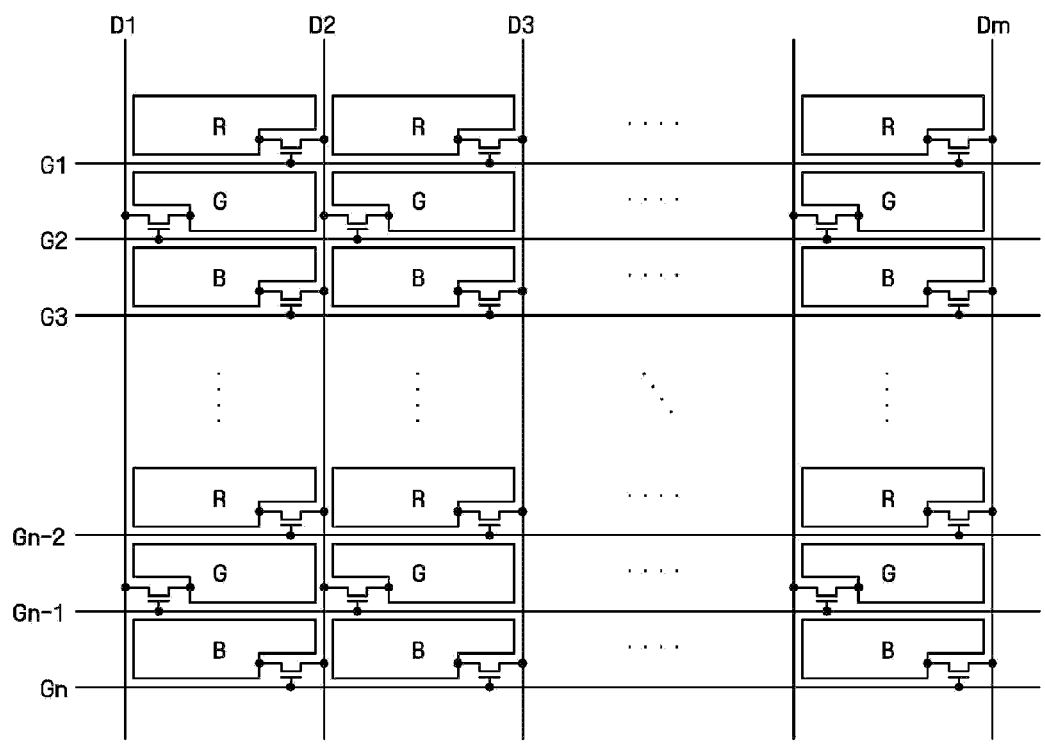
FIG. 8 is a plan view illustrating an exemplary embodiment of a structure of pixels of the liquid crystal display shown in FIG. 6.

Hereinafter, a liquid crystal display according to an exemplary embodiment will be described in further detail with reference to FIGS. 6 through 8. FIG. 6 is a block diagram of an exemplary embodiment of a liquid crystal display according to the present invention, FIG. 7 is an equivalent circuit diagram of a pixel of the liquid crystal display shown in FIG. 6, and FIG. 8 is a plan view illustrating an exemplary embodiment of a structure of pixels of the liquid crystal display shown in FIG. 6.

Referring to FIG. 6, a liquid crystal display 10 according to an exemplary embodiment includes a liquid crystal panel 300, a timing controller 500, a clock generator 600, a gate driver 400 and a data driver 700. The timing controller 500 and the clock generator 600 comprise a signal supply.

The LCD panel 300 is divided into a display area DA, where an image is displayed, and a non-display area PA, e.g., a peripheral area PA, where an image is not displayed.

The display area DA includes a first substrate (100), which includes a plurality of the gate lines G1 to Gn, a plurality of the data lines D1 to Dm, switching elements (Q) and pixel electrodes (PE) disposed thereon, a second substrate (200), which includes color filters (CF) and a common electrode (CE) formed thereon and a liquid crystal layer (150) interposed between the first substrate 100 and the second substrate 200, thereby displaying an image. The gate lines G1 to Gn extend in a first direction, such as a substantially row direction as viewed in FIG. 6, and are substantially in parallel with one another, and the data lines D1 to Dm extend in a second direction, such as a substantially column direction, substantially in parallel with one another. In an exemplary embodiment, the first direction is substantially perpendicular to the second direction.

Referring to FIG. 7, an exemplary embodiment of one of the pixels PX shown in FIG. 6 will now be described in further detail. The pixel PX according to an exemplary embodiment includes the color filter CF, which may be disposed on the common electrode CE of the second substrate 200, such that the color filter CF is disposed to face the pixel electrode PE of the first substrate 100. In an exemplary embodiment, the pixel PX, which is connected to an ith gate line Gi (where i=1 to n) and to a jth data line Dj (where j=1 to m), includes the switching element Q, which is connected to a signal line (e.g., at least one of the ith gate line Gi and the jth data line Dj), and a liquid crystal capacitor Clc and a storage capacitor Cst which are connected to the switching element Q. However, in an alternative exemplary embodiment, the storage capacitor Cst may be omitted. In an exemplary embodiment, the switching element Q may be a thin film transistor ("TFT") made from amorphous silicon ("a-Si"). As shown in FIG. 8, each pixel PX is larger in a horizontal direction, e.g., the first direction, than in a longitudinal direction, e.g., the second direction, and red filters R, green filters G and blue filters B filters are arranged in horizontal rows. Put another way, the red, green and blue color filters R, G and B, respectively, are arranged in an alternating manner in columns disposed between adjacent data lines of the data lines D1 to Dm.

As shown in FIG. 6, the first substrate 100 is larger in size than the second substrate 200, such that the non-display area PA does not display an image.

The signal supply, including the timing controller 500 and the clock generator 600, receives input image signals R,G,B and an input-control signal and controls a display of an image from a graphic controller (not shown). In addition, the signal supply supplies an image signal DAT and a data control signal CONT to the data driver 700. Specifically, in exemplary embodiments, the timing controller 500 receives the input control signal which includes, for example, a horizontal synchronization signal $H_{sync}$, a vertical synchronization signal $V_{sync}$, a main clock signal $M_{clk}$ and a data enable signal DE. The timing controller 500 supplies the data control signal CONT to the data driver 700. In an exemplary embodiment, the data control signal CONT controls an operation of the data driver 700. The data control signal CONT includes, for example, a horizontal start signal for starting an operation of data driver 700 and a load signal for instructing an output of data voltages.

The data driver 700 receives the image signal DAT and the data control signal CONT, and the data driver 700 supplies an image data voltage corresponding to the image signal DAT to the data lines D1 to Dm. In an exemplary embodiment, the data driver 700 is an integrated circuit ("IC"), and is connected to the liquid crystal panel 300 via a tape carrier package ("TCP"), however, alternative exemplary embodiments are not limited thereto. In an exemplary embodiment, the data driver 700 may be disposed in the non-display area PA of the liquid crystal panel 300.

The signal supply receives the vertical sync signal $V_{sync}$, and the main clock signal $M_{clk}$ from an external graphics controller (not shown). The signal supply receives a gate-on voltage Von and a gate-off voltage Voff from a voltage generator (not shown), and the signal supply supplies a first scan start signal STVP, a clock signal CKV, a clock bar signal CKVB and the gate-off voltage Voff to the gate driver 400. Specifically, the timing controller 500 supplies a second scan start signal STV, a first clock generation control signal OE and a second clock generation control signal CPV to a clock generator 600. The clock generator 600 receives the second scan start signal STV, and outputs the first scan start STVP to the gate driver 400. Furthermore, the clock generator 600 receives the first clock generation control signal OE and the second clock generation control signal CPV, and the clock generator 600 supplies the clock signal CKV and the clock bar signal CKVB to the gate driver 400. In an exemplary embodiment, a phase of the clock signal CKV is inverse to a phase of the clock bar signal CKVB.

The gate driver 400 is enabled by the first scan start STVP and generates a plurality of gate signals using the clock signal CKV, the clock bar signal CKVB and the gate-off voltage Voff. The gate driver 400 sequentially supplies a gate signal of the plurality of gate signals to each gate line G1 to Gn. The gate driver 400 according to an exemplary embodiment includes the gate driving device, described in further detail above, and a repetitive detailed description thereof has been omitted.

Thus, the liquid crystal display 10 according to an exemplary embodiment substantially improves a driving capability of the pull-up transistor of the second dummy stage of the gate driving device, thereby providing for gate signals to the gate lines in a stable manner. Furthermore, even when numbers of gate lines and stages are substantially increased, the gate signals are provided to the gate lines in the stable manner, and a display quality is thereby substantially improved.

Figure 9:
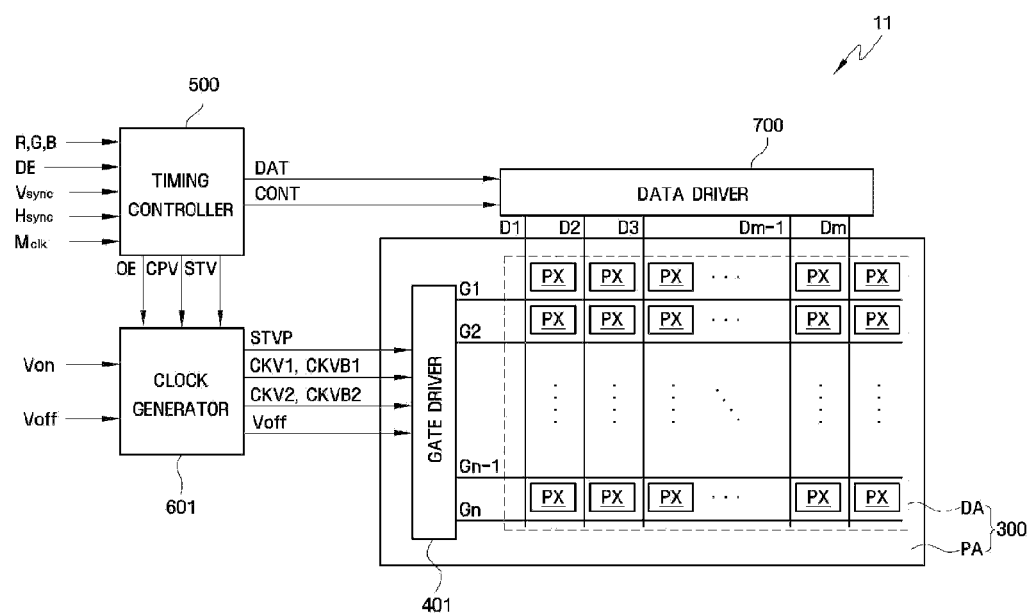
FIG. 9 is a block diagram of an alternative exemplary embodiment of a liquid crystal display according to the present invention.
Figure 10:
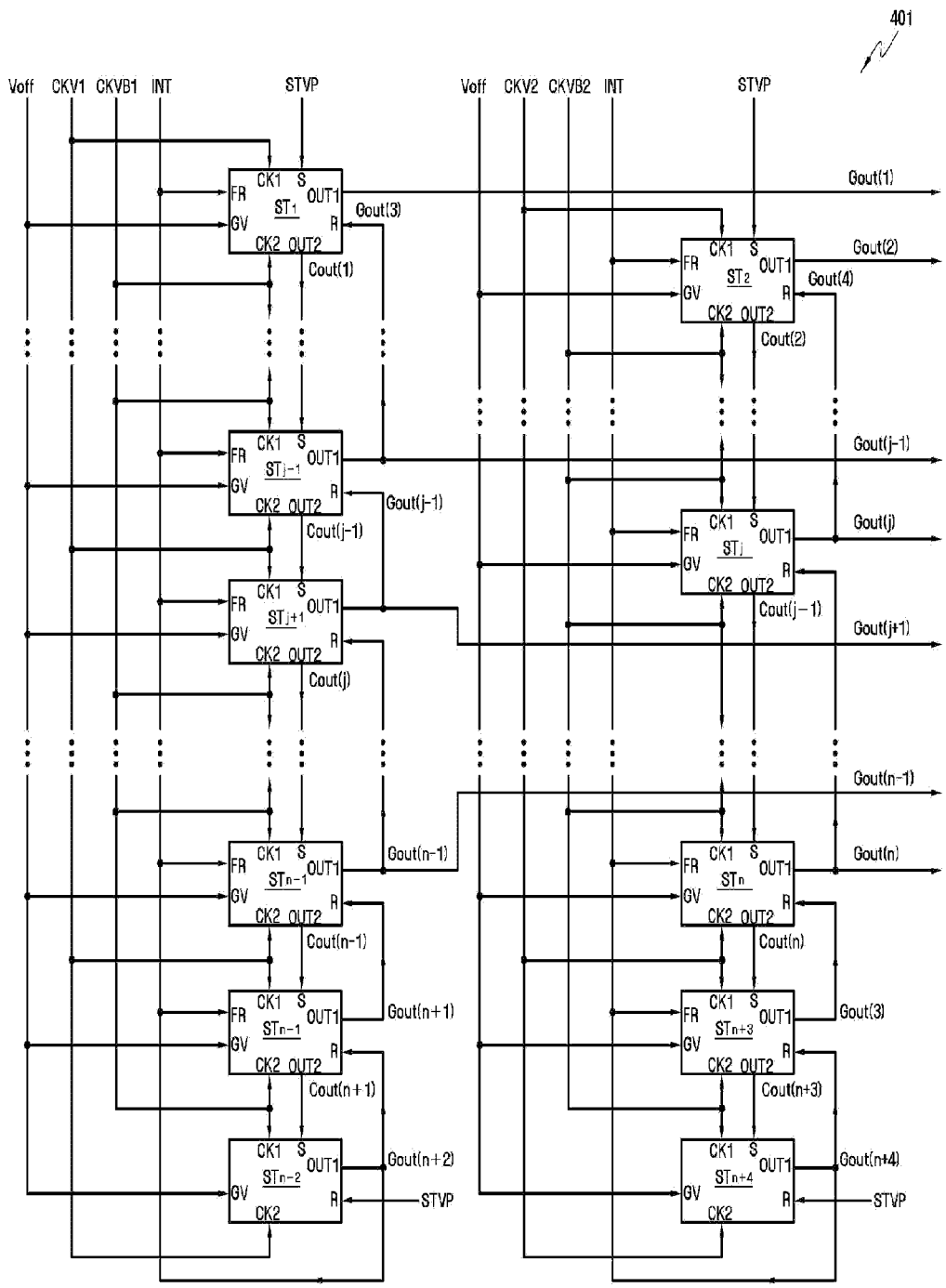
FIG. 10 is a block diagram of an exemplary embodiment of a gate driving device of the liquid crystal display shown in FIG. 9.

Hereinafter, a liquid crystal display according to an alternative exemplary embodiment will be described in further detail with reference to FIGS. 9 and 10. FIG. 9 is a block diagram of an alternative exemplary embodiment of a liquid crystal display according to the present invention, and FIG. 10 is a block diagram of an exemplary embodiment of a gate driving device of the liquid crystal display shown in FIG. 9. A liquid crystal display 11 according to an alternative exemplary embodiment is different from the liquid crystal display 10 according to exemplary embodiment described above in that a plurality of stages are divided into a first group and a second group. Hereinafter, the liquid crystal display 11 will be described in further detail with respect to a gate driver 401, and any repetitive description of substantially the same or like elements as those of the liquid crystal display 10 according exemplary embodiment described above will be simplified or omitted.

Referring to FIGS. 9 and 10, the gate driver 401 of the liquid crystal display 11 according to an alternative exemplary embodiment further includes a third dummy stage $ST_{n+3}$ and a fourth dummy stage $ST_{n+4}$. The third dummy stages $ST_{n+3}$ and the fourth dummy stage $ST_{n+4}$. In addition, the plurality of stages are divided into the first group, corresponding to, e.g., connected to, the first dummy stage $ST_{n+1}$ and the second dummy stage $ST_{n+2}$, and a second group corresponding to, e.g., connected to, the third dummy stage $ST_{n+3}$ and the fourth dummy stage $ST_{n+4}$, as shown in FIG. 10. More specifically, the gate driving device 401 includes stages $ST_1, ST_3, \ldots, STn-1$ of the first group and connected to the first dummy stage STn+1 and the second dummy stage STn+2, which are sequentially arranged, and stages $ST_2, ST_4, \ldots, ST_n$ of the second group, which are sequentially arranged and connected to the third dummy stage $ST_{n+3}$ and the fourth dummy stage $ST_{n+4}$.

Thus, in an exemplary embodiment, the stages $ST_1$ to $ST_n$ may alternately belong to the first group and the second group. Put another way, in the first to nth stages $ST_1$ to $ST_n$ connected to the first to nth gate lines G1 to Gn, the first stage $ST_1$ connected to the first gate line G1 belongs to the first group, the second stage $ST_2$ connected to the second gate line G2 belongs to the second group, and the third stage $ST_3$ connected to the third gate line G3 belongs to the first group. Consequently, the stages $ST_1, ST_3, \ldots, STn-1$ connected to odd-numbered gate lines belong to the first group, and the stages $ST_2, ST_4, \ldots, ST_n$ connected to even-numbered gate lines belong to the second group. However, alternative exemplary embodiments are not limited thereto. Specifically, the stages $ST_1$ to $ST_n$ may be divided into first and second groups in various alternative ways, and may be divided into multiple groups, e.g., more groups than only the first group and the second group.

Furthermore, in an alternative exemplary embodiment, the gate driver 401 may include a first gate driver and a second gate driver. The first gate driver drives the first group having the stages $ST_1, ST_3, \ldots, STn-1$ and the first dummy stage STn+1 and the second dummy stage STn+2 sequentially arranged. The second gate driver drives the second group having the stages $ST_2, ST_4, \ldots, ST_n$ and the third dummy stage $ST_{n+3}$ and the fourth dummy stage $ST_{n+4}$ sequentially arranged. In an exemplary embodiment, the first gate driver and the second gate driver are disposed at opposite sides of the liquid crystal panel 300 and apply the gate signals to the gate lines G1 to Gn.

More specifically, for example, from among the gate lines G1 to Gn, odd-numbered gate lines G1, G3, \ldots, Gn-1 are connected to the stages $ST_1, ST_3, \ldots, STn-1$ of the gate driver provided at the left side of the liquid crystal panel 300, e.g., the first gate driver, and receive gate signals. Similarly, even-numbered gate lines G2, G4, \ldots, Gn are connected to the stages $ST_2, ST_4, \ldots, ST_n$ of the gate driver provided at the right side of the liquid crystal panel 300, e.g., the second gate driver, and receive gate signals.

A clock generator 601 receive a first clock signal CKV1 and a second clock signal CKV2 and outputs a first clock bar signal CKVB1 and a second clock bar signal CKVB2. More specifically, the clock generator 601 may receive the second scan start signal STV to output the first scan start signal STVP, may receive the first clock generation control signal OE and the second clock generation control signal CPV to output the first clock signal CKV1 and the second clock signal CKV2, respectively, and the first clock bar signal CKVB1 and the second clock bar signal CKVB2, respectively. In an exemplary embodiment, the first clock signal CKV1 and the second clock signal CKV2 are the clock signal CKV, and are inverse-phase signals of the first clock bar signal CKVB1 and the second clock bar signal CKVB2. In addition, in an exemplary embodiment, the second clock signal CKV2 and the second clock bar signal CKVB2 may be different from the first clock signal CKV1 and the first clock bar signal CKVB1.

Referring to FIG. 10, the third dummy stage $ST_{n+3}$ and the fourth dummy stage $ST_{n+4}$ correspond to the first dummy stage STn+1 and the second dummy stage STn+2 (FIG. 1), respectively. However, the first dummy stage STn+1 and the second dummy stage STn+2 are driven by the first clock signal CKV1 and the first clock bar signal CKVB1, while the third dummy stages $ST_{n+3}$ and the fourth dummy stage $ST_{n+4}$ are driven by the second clock signal CKV2 and the second clock bar signal CKVB2. Since the third dummy stage $ST_{n+3}$ and the fourth dummy stage $ST_{n+4}$ are substantially the same as the first dummy stage STn+1 and the second dummy stage STn+2, any repetitive detailed explanation thereof will hereinafter be omitted.

In an exemplary embodiment, the third dummy stage $ST_{n+3}$ includes a fourth charge unit 420 which receives a carry signal Cout(n) of a previous stage, e.g., an nth stage $ST_n$, as an input signal and is thereby charged, and a fourth pull-up transistor T1 which outputs a second clock signal CKV2 when the fourth charge unit 420 reaches a first charge level. The fourth dummy stage $ST_{n+4}$ includes a fifth charge unit 420 which receives a carry signal Cout(n+3) of the third dummy stage $ST_{n+3}$ as an input signal and is thereby charged, and a fifth pull-up transistor T1 which outputs a second clock signal CKV when the fifth charge unit 420 reaches a second charge level.

Here, the pull-up transistor T1 of the fourth dummy stage $ST_{n+4}$ outputs the second clock signal CKV when a higher charge level is reached than in the pull-up transistor T1 of the third dummy stage $ST_{n+3}$, as described in greater detail above with reference to the pull-up transistors T1 of the first dummy stage STn+1 and the second dummy stage STn+2.

Furthermore, the fourth dummy stage $ST_{n+4}$ outputs a gate signal Gout(n+4) as an initialization signal INT to the stages $ST_1$ to $ST_n$ and the third dummy stage $ST_{n+3}$ of the second group to initialize the stages $ST_1$ to $ST_n$ and the third dummy stage $ST_{n+3}$ of the second group. In addition, a carry signal generating transistor T15 of a carry signal generator of the third dummy stage $ST_{n+3}$, a buffer transistor T4 and a discharge unit of the third dummy stage $ST_{n+4}$, are substantially the same as those described in greater detail above with reference to the first dummy stage STn+1 and the second dummy stage STn+2.

Thus, exemplary embodiments as described herein provide a gate driving device, wherein a driving capability of a pull-up transistor of a second dummy stage is substantially improved, thereby providing for stabilization of an initialization signal provided to a plurality of stages and a first dummy stage, so that gate signals are applied to gate lines even when numbers of gate lines and stages are substantially increased. Accordingly, a display quality of a liquid crystal display according to an exemplary embodiment is substantially improved.

Figure 11:
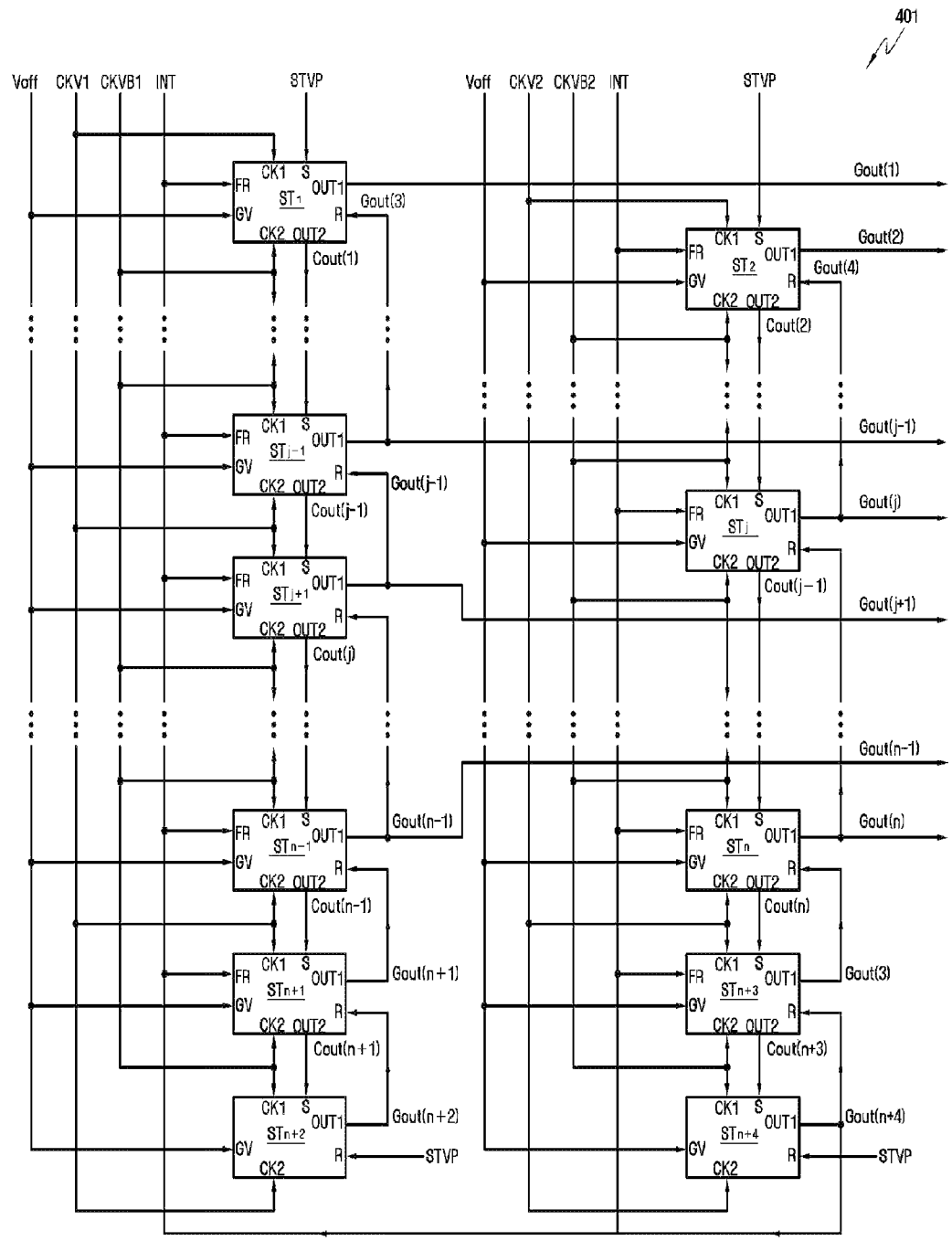
FIG. 11 is a block diagram of an alternative exemplary embodiment of a gate driving device of the liquid crystal display shown in FIG. 9.

Hereinafter, a liquid crystal display according to an alternative exemplary embodiment will be described in further detail with reference to FIG. 11. FIG. 11 is a block diagram of an alternative exemplary embodiment of a gate driving device of the liquid crystal display shown in FIG. 9. In FIG. 11, the same reference character denote the same or like elements in FIG. 10, and thus any repetitive detailed description thereof will hereinafter be simplified or omitted.

Referring to FIG. 11, an alternative exemplary gate driver 402 of the liquid crystal display 11 according to an alternative exemplary embodiment comprises the fourth dummy stage $ST_{n+4}$ outputting a gate signal Gout(n+4) as an initialization signal INT to the stages $ST_1$ to $ST_n$, the first dummy stage $ST_{n+1}$ and the third dummy stage $ST_{n+3}$ of the first and second group to initialize the stages $ST_1$ to $ST_n$ the first dummy stage $ST_{n+1}$ and the third dummy stage $ST_{n+3}$ of the first and second group.

In other words, the gate signal Gout(n+4) output from the fourth dummy stage $ST_{n+4}$ is transmitted to not only the stages $ST_1$, $ST_3$, . . . , $ST_{n-1}$ and the third stage $ST_3$ of the second group but also the stages $ST_2$, $ST_4$, . . . , $ST_n$ and the first stage $ST_1$ of the first group.

The present invention should not be construed as being limited to the exemplary embodiments set forth herein. Rather, these exemplary embodiments are provided so that this disclosure will be thorough and complete and will fully convey the concept of the present invention to those skilled in the art. It is therefore desired that the present embodiments be considered in all respects as illustrative and not restrictive.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A gate driving device comprising:
a plurality of stages;
a first dummy stage connected to the plurality of stages; and
a second dummy stage connected to the first dummy stage, wherein
stages of the plurality of stages are cascaded,
the first dummy stage comprises:
a first charge unit which receives a first input signal from a previous stage of the plurality of stages and is thereby charged; and
a first pull-up transistor which outputs a clock signal when the first charge unit reaches a first charge level, and
the second dummy stage comprises:
a second charge unit which receives a second input signal from the first dummy stage and is thereby charged; and
a second pull-up transistor which outputs the clock signal when the second charge unit reaches a second charge level,
wherein a channel width of the second pull-up transistor is greater than a channel width of the first pull-up transistor.

2. The gate driving device of claim 1, wherein each stage of the plurality of stages includes a third charge unit which receives a third input signal from a previous stage of said each stage of the plurality of stages and is thereby charged, and a third pull-up transistor which outputs the clock signal when the third charge unit reaches the first charge level.

3. The gate driving device of claim 2, wherein
each stage of the plurality of stages includes a first capacitor which receives the third input signal and is thereby charged, and a first carry signal generating transistor which outputs the clock signal as a first carry signal when the first capacitor reaches a third charge level, and
the first dummy stage includes a second capacitor which receives the first input signal and is thereby charged, and a second carry signal generating transistor which outputs the clock signal as a second carry signal, wherein the second carry signal generating transistor is controlled by the second capacitor.

4. The gate driving device of claim 3, wherein a channel width of the second pull-up transistor is determined by a value obtained by multiplying a total parasitic capacitance generated by a gate signal outputted from the second dummy stage with a ratio of a channel width of the third pull-up transistor to a parasitic capacitance of a gate line connected to the third pull-up transistor.

5. The gate driving device of claim 2, wherein
the first dummy stage includes a first buffer transistor which transmits the first input signal to the first charge unit,
the second dummy stage includes a second buffer transistor which transmits the second input signal to the second charge unit, and
a channel width of the second buffer transistor is greater than a channel width of the first buffer transistor.

6. The gate driving device of claim 1, wherein the second dummy stage outputs a gate signal to the plurality of stages and the first dummy stage to initialize the plurality of stages and the first dummy stage.

7. A liquid crystal display comprising:
a liquid crystal panel including gate lines; and
a gate driving device including a plurality of stages, a first dummy stage connected to the plurality of stages and a second dummy stage connected to the first dummy stage,
wherein
stages of the plurality of stages are cascaded,
the first dummy stage comprises:
a first charge unit which receives a first input signal from a previous stage of the plurality of stages and is thereby charged; and
a first pull-up transistor which outputs a clock signal when the first charge unit reaches a first charge level, and
the second dummy stage comprises:
a second charge unit which receives a second input signal from the first dummy stage and is thereby charged; and
a second pull-up transistor which outputs the clock signal when the second charge unit reaches a second charge level,
wherein a channel width of the second pull-up transistor is greater than a channel width of the first pull-up transistor.

8. The liquid crystal display of claim 7, wherein each of the plurality of stages includes a third charge unit which receives a third input signal from a previous stage of the plurality of stages and is thereby charged, and a third pull-up transistor which outputs the clock signal when the third charge unit reaches the first charge level.

9. The liquid crystal display of claim 8, wherein
each stage of the plurality of stages includes a first capacitor which receives the third input signal and is thereby charged, and a first carry signal generating transistor which outputs the clock signal as a first carry signal when the first capacitor reaches a third charge level, and
the first dummy stage includes a second capacitor which receives the first input signal and is thereby charged, and a second carry signal generating transistor which outputs the clock signal as a second carry signal when the second capacitor reaches a fourth charge level higher than the third charge level.

10. The liquid crystal display of claim 9, wherein a width of the second pull-up transistor is determined by a value obtained by multiplying a total parasitic capacitance generated by a gate signal outputted from the second dummy stage with a ratio of a channel width of the third pull-up transistor to a parasitic capacitance of a gate line connected to the third pull-up transistor.

11. The liquid crystal display of claim 9, wherein
the second charge level of the second pull-up transistor is determined by the total parasitic capacitance generated by the gate signal outputted from the second dummy stage, and
the first charge level of the first pull-up transistor is determined by the second charge level of the second pull-up transistor.

12. The liquid crystal display of claim 8, wherein
the first dummy stage includes a first buffer transistor which transmits the first input signal to the first charge unit,
the second dummy stage includes a second buffer transistor which transmits the second input signal to the second charge unit, and
a channel width of the second buffer transistor is greater width than a channel width of the first buffer transistor.

13. The liquid crystal display of claim 7, wherein the second dummy stage outputs the gate signal to the plurality of stages and the first dummy stage to initialize the plurality of stages and the first dummy stage.

14. The liquid crystal display of claim 13, further comprising a third dummy stage and a fourth dummy stage, wherein
the plurality of stages are divided into a first group and a second group,
the first group is connected to the first dummy stage and the second dummy stage,
the second group is connected to the third dummy stage and the fourth dummy stage,
the third dummy stage includes a fourth charge unit which receives a fourth input unit from a previous stage of the second group and is thereby charged, and a fourth pull-up transistor which outputs a second clock signal when the fourth charge unit reaches the first charge level,
the fourth dummy stage includes a fifth charge unit which receives a fifth input unit from the third dummy stage and is thereby charged, and a fifth pull-up transistor which outputs the second clock signal when the fifth charge unit reaches a second charge level higher than the first charge level, and
the first clock signal and the second clock signal are different from each other.

15. The liquid crystal display of claim 14, wherein the fourth dummy stage outputs a gate signal to the second group and the third dummy stage to initialize the second group and the third dummy stage.

16. A liquid crystal display comprising:
a liquid crystal panel including gate lines; and
a gate driving device including a plurality of stages, a first dummy stage connected to the plurality of stages and a second dummy stage connected to the first dummy stage,
wherein
stages of the plurality of stages are cascaded,
the stages are connected to gate lines to sequentially supply gate signals thereto
the first dummy stage comprises:
a first charge unit which receives a first input signal from a previous stage of the plurality of stages and is thereby charged; and
a first pull-up transistor which has a first channel width, and the second dummy stage comprises:
a second charge unit which receives a second input signal from the first dummy stage and is thereby charged; and
a second pull-up transistor which has a second channel width greater than the first channel width.

17. The liquid crystal display of claim 16, wherein
the first pull-up transistor outputs a first clock signal when the first charge unit reaches a first charge level, and
the second pull-up transistor outputs the first clock signal when the second charge unit reaches a second charge level higher than the first charge level.

18. The liquid crystal display of claim 16, wherein
the first dummy stage includes a first buffer transistor which transmits the first input signal to the first charge unit,
the second dummy stage includes a second buffer transistor which transmits the second input signal to the second charge unit, and
a channel width of the second buffer transistor is greater than a channel width of the first buffer transistor.

* * * * *